(12) United States Patent
Schaeffer et al.

(10) Patent No.: US 6,730,413 B2
(45) Date of Patent: May 4, 2004

(54) THERMAL BARRIER COATING

(75) Inventors: Jon C. Schaeffer, Greenville, SC (US); Robert W. Bruce, Loveland, OH (US)

(73) Assignee: General Electric Company, Schenectady, NY (US)

( * ) Notice: Subject to any disclaimer, the term of this patent is extended or adjusted under 35 U.S.C. 154(b) by 0 days.

(21) Appl. No.: 09/917,796

(22) Filed: Jul. 31, 2001

(65) Prior Publication Data

US 2003/0027013 A1 Feb. 6, 2003

(51) Int. Cl.$^7$ .............................. B32B 15/04; F03B 3/12
(52) U.S. Cl. ...................... 428/632; 428/633; 428/679; 428/680; 428/336; 416/241 B
(58) Field of Search ................... 428/336, 613, 428/621, 632, 650, 655, 670, 680, 469, 697, 699, 701, 702, 633; 416/241 B

(56) References Cited

U.S. PATENT DOCUMENTS

| | | | |
|---|---|---|---|
| 4,485,151 A | | 11/1984 | Stecura |
| 5,073,433 A | | 12/1991 | Taylor |
| 5,780,171 A | * | 7/1998 | Nissley et al. |
| 5,981,088 A | | 11/1999 | Bruce |
| 6,042,898 A | * | 3/2000 | Burns et al. |
| 6,047,539 A | * | 4/2000 | Farmer |
| 6,352,788 B1 | * | 3/2002 | Bruce |
| 6,432,487 B1 | | 8/2002 | Graham et al. |

FOREIGN PATENT DOCUMENTS

EP          0705911          4/1996

OTHER PUBLICATIONS

Patent Abstracts of Japan; vol. 2000. No. 13, Feb. 5, 2001 (abstract).
European Search Report No Date.

* cited by examiner

*Primary Examiner*—Jennifer McNeil
(74) *Attorney, Agent, or Firm*—Nixon & Vanderhye P.C.

(57) ABSTRACT

A thermal insulating ceramic layer for use on metal alloy components exposed to hostile thermal and chemical environment, such as a gas turbine engine used to generate electricity. The preferred thermal barrier layer is formed using dense vertical cracking and formed of zirconia that is partially stabilized by yttria in a preferred amount of less than 4 weight percent and about 1 weight percent Hafnia. The ceramic layer is optimized to protect the underlying superalloy component from erosion, chipping, and handling, while reducing the cost of the protective layer. An alternative method of preparing the thermal barrier coating uses electron beam physical vapor deposition.

4 Claims, 1 Drawing Sheet

THERMAL BARRIER COATING

BACKGROUND OF THE INVENTION

This invention relates to protective coatings for metal alloy components exposed to high temperature gas environments and severe operating conditions, such as the working components of gas turbine engines used in electrical power generation. More particularly, the invention relates to a new type of thermal barrier coating ("TBC") for use in gas turbine engines and a method for applying the new TBC coatings to metal substrates. The coating consists of a thermal insulating ceramic layer whose composition and deposition significantly enhance the erosion resistance of the turbine components while maintaining a spallation resistance equivalent to or better than conventional coatings. The preferred coating composition is applied using a dense vertically cracked vapor deposition process.

The operating conditions to which gas turbine hardware components are exposed can be thermally and chemically severe. Thus, by necessity the surfaces of the metal substrates used to form turbine, combustor and augmentor components must exhibit greater than average mechanical strength, durability and erosion resistance in a very hostile, high temperature gas environment. As used herein, the term "erosion" refers to the process whereby a surface, particularly metal, is bombarded by contaminant particles of sufficiently high energy that cause other particles to be ejected (eroded) from the surface, resulting in degradation and cracking of the substrate material.

In recent years, significant advantages have been achieved by using high temperature alloys in gas turbine systems by incorporating iron, nickel and cobalt-based superalloys in coatings applied to the substrate of key turbine components. The purpose of an effective surface coating is two-fold. First, the coating must form a protective and adherent layer that guards the underlying base material against oxidation, corrosion, and degradation. Second, the coating should have low thermal conductivity relative to the substrate. As superalloy compositions have become more complex, it has been increasingly difficult to obtain both the higher strength levels that are required (particularly at increased gas turbine operating temperatures) and a satisfactory level of corrosion and oxidation resistance. The trend towards higher gas turbine firing temperatures has made the oxidation, corrosion and degradation problems even more difficult. Thus, despite recent improvements in thermal barrier coatings, a significant need still exists for more effective, less degradable high temperature coatings since most alloy components cannot withstand the long service exposures and repetitive cycles encountered in a typical gas turbine environment.

Many of the known prior art coatings used for gas turbine components include aluminide, MCrAlY and ceramic components. Typically, ceramic coatings have been used in conjunction with a bond coating formed from an oxidation-resistant alloy such as MCrAlY, where M is iron, cobalt, and/or nickel, or from a diffusion aluminide or platinum aluminide that forms an oxidation-resistant intermetallic. In higher temperature applications, these prior art bond coatings form an oxide layer or "scale" that chemically bonds to the ceramic layer to form the final bond coating.

In the past, it has also been known to use zirconia ($ZrO_2$) that is partially or fully stabilized by yttria ($Y_2O_3$), magnesia (MgO) or other oxides as the primary constituent of the ceramic layer. Yttria-stabilized zirconia (hereafter "YSZ") is often used as the ceramic layer for thermal bond coatings because it exhibits favorable thermal cycle fatigue properties. That is, as the temperature increases or decreases during gas turbine start up and shut down, the YSZ is capable of resisting stresses and fatigue much better than other known coatings. Typically, the YSZ is deposited on the metal substrate using known methods, such as air plasma spraying ("APS"), low pressure plasma spraying ("LPPS"), as well as by physical vapor deposition ("PVD") techniques such as electron beam physical vapor deposition ("EBPVD"). Notably, YSZ deposited by EBPVD is characterized by a strain-tolerant columnar grain structure that enables the substrate to expand and contract without causing damaging stresses that lead to spallation. The strain-tolerant nature of such systems is now documented in the literature.

Stabilization with yttria serves to prevent zirconia from undergoing a tetragonal to monoclinic phase transformation at about 1000° C. that would otherwise result in detrimental volume expansion and eventual coating failure. In the mid-1980s, Stephan Stecura at NASA determined that zirconia stabilized with 7 weight % yttria ("7 YSZ") was the best composition for spallation resistance on a superalloy substrate. (See U.S. Pat. No. 4,485,151). Stecura concluded that 6–8 weight % yttria stabilized zirconia ("6–8 YSZ") was optimal when the coating was applied using air plasma spraying.

Thus, since the mid-to-late 1980s, conventional practice in the art has been to "partially stabilize" zirconia with at least 6–8 weight % yttria. The Stecura '151 patent teaches against using lesser amounts of yttria since the zirconia is described as being only "partially" stabilized to provide an optimum mixture of cubic, tetragonal and monoclinic phases of coating material. Thus, historically those skilled in the art have considered the 6–8 percent level of yttria recommended by Stecura as the lowest effective amount that would produce an acceptable coating capable of demonstrating sufficient spallation resistance under the extreme operating conditions of gas turbine engines.

More recently, an improved thermal ceramic layer for use in hostile thermal environments has been developed by The General Electric Company formed from zirconia stabilized by yttria. The ceramic is characterized by a columnar grain structure in which a monoclinic phase is present. Commonly assigned U.S. Pat. No. 5,981,088 discloses using about 2 to 5% by weight yttria to stabilize the zirconia, with the coating being deposited on the substrate using electron beam physical vapor deposition ("EBPVP"). The ceramic coatings described in the '088 patent have been found particularly beneficial for use on aircraft engine components that must withstand a high number of thermal cycles.

Despite the recent developments in coatings summarized above, there remains a need in the art for an improved zirconia-based coating that is optimal for use in forming protective coatings on metal alloy components exposed to high temperature environments in gas turbine engine components used for electrical power generation. The need also exists for improved methods of applying such coatings to key turbine components exposed to hostile chemical conditions at high temperatures. That is, a need still exists for improved yttria-stabilized zirconia coatings that have strong chemical and erosion resistance when exposed to very hot exhaust gases, while maintaining a spallation resistance comparable to conventional systems such as those taught by Stecura.

BRIEF SUMMARY OF THE INVENTION

The present invention meets the above needs by providing a new thermal insulating ceramic layer for use in a thermal barrier coating system on metal alloy components designed for use in a hostile thermal environment. Components that are well-suited for coating are nozzles, buckets, shrouds, airfoils, and other combustion hardware found in the hot gas paths of gas turbine engines. The coatings of the present invention tend to reduce the temperature at the surface of the metal alloy because the thermal conductivity of the coating is an order of magnitude lower than that of the metal substrate. Only a thin layer of ceramic is required to reduce the heat flux to a metal when a thermal gradient exists (5–50 mils). The temperature at the surface of the metal can be up to 400° F. lower than the temperature at the surface of the ceramic coating. The ceramic layers are particularly suited to applications where the gas temperature is in excess of 1000° C. and/or where severe thermal cycle fatigue stresses exist due to repeated start ups and shut downs of the gas turbine.

Surprisingly, it has now been found that an improved thermal insulating ceramic layer in accordance with the invention can be formed of zirconia that has been partially stabilized by yttria in the amount substantially lower than predicted by Stecura, namely about 4 weight % (referred to herein as "4 YSZ"). For the first time, it has also been found that the yttria-stabilized zirconia can be applied using a dense vertically cracked ("DVC") vapor deposition process. Using the DVC process, the yttria transforms the ceramic into a tetragonal crystal structure that resists volume changes during repeated thermal cycling. The stabilized transformation also toughens the zirconia when mechanical stresses are applied. Preferably, the zirconia formed using the DVC process includes 0–1% by weight Hafnia ($HfO_2$) in solid solution.

Thermal barrier coating systems that incorporate a ceramic layer in accordance with the invention have been found to exhibit increased erosion resistance, chipping resistance, and prolonged cycle life. The ceramic layer is also significantly less expensive because of the reduced amount of yttria used to stabilize the zirconia. Other objects and advantages of this invention will be better appreciated from the detailed description that follows.

DETAILED DESCRIPTION OF THE INVENTION

Figure 1:
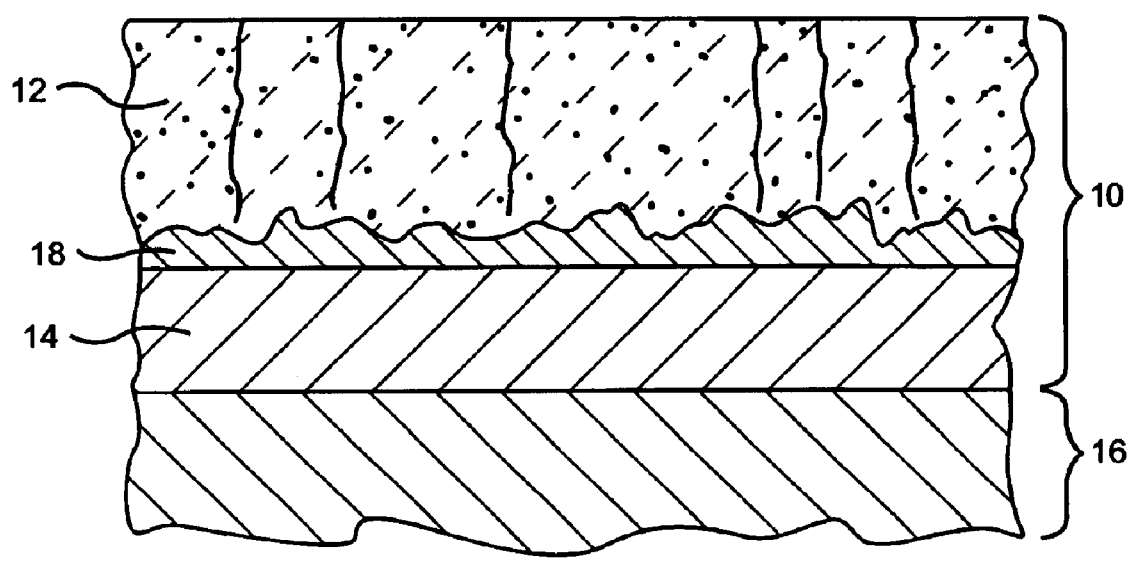
FIG. 1 is a cross-sectional view of a metal substrate, such as a high pressure gas turbine blade, showing the thermal barrier coating as applied to the blade using a dense vertically cracked deposition technique ("DVC") in accordance with the invention.

As noted above, thermal barrier coatings according to the present invention are applicable to various metal alloy components (so-called "superalloys") that must still be protected from a thermally and chemically hostile environment. Examples of such components include nozzles, buckets, shrouds, airfoils, and other hardware found in almost any gas turbine engine. While the advantages of the invention are particularly applicable to gas turbine engine components, the teachings are generally applicable to any component on which a coating may be used to thermally and chemically insulate the item from its environment.

High pressure turbine blades are prime examples of the substrates to which coatings in accordance with the invention can be applied using a dense vertically cracked deposition technique. Typically, turbine blades have an airfoil and a platform against which hot combustion gases are directed during operation of the gas turbine. Thus the airfoil surfaces are subjected to attack by oxidation, corrosion, and erosion. The airfoil normally is anchored to a turbine disk with a dovetail formed on a root section of the blade.

FIG. 1 shows a thermal barrier coating in accordance with the invention as applied to a substrate using a DVC technique like thermal spray. The coating 10 includes a thermal-insulating ceramic layer 12 over a bond coating 14 that overlies a metal alloy substrate 16 which typically forms the base material of the turbine blade. Suitable materials for the substrate include iron, nickel, and cobalt-base superalloys. As indicated above, the bond coating must be oxidation resistant and typically forms an alumina layer 18 on the surface of the bond coating when the coated blade is exposed to elevated temperatures. The alumina layer serves to protect the underlying superalloy substrate 16 from oxidation and provides a surface to which the ceramic layer adheres.

According to the present invention, the preferred material for the ceramic layer 12 consists of zirconia partially stabilized with about 4 weight % yttria. The zirconia also includes 0–1% Hafnia ($HfO2$) in solid solution. The ceramic layer preferably is applied with the dense vertically cracked ("DVC") process such as plasma spray. The yttria transforms the ceramic into a tetragonal crystal structure that effectively resists volume changes during thermal cycling. The stabilized transformation also toughens the zirconia when mechanical stresses are applied to the turbine blade during, for example, startup and shutdown.

Bond coating 14 is formed from an oxidation-resistant alloy such as MCrALY, where M is iron, cobalt, and/or nickel, or from a diffusion aluminide or platinum aluminide that forms an oxidation-resistant intermetallic. Such bond coatings are well known in the art and typically range in thickness from about 0.003 to about 0.025 inches.

The preferred DVC system is a high density spray process where the substrate preheat and gun-to-work distance is tightly controlled in order to adjust and control the coefficient of thermal expansion and vertical cracking upon cooling to room temperature. The vertical cracks are perpendicular to the metal substrate surface and allow strain compliance during thermal cycling. This allows the cracks to expand and contract with changing temperature, thereby avoiding damaging stresses that can lead to spallation. Heretofore, the DVC thermal barrier coating process has been used in the past on power system components, but not in conjunction with the yttria-stabilized zirconia coatings according to the invention.

Alternatively, an EBPVD thermal barrier coating can be applied to the metal substrate using an electron beam process where an ingot of the YSZ is vaporized and then physically deposited or condensed out on a component. Although EBPVD achieves a similar columnar microstructure for strain accommodation and has excellent surface finish, EBPVD typically does not achieve the same level of erosion resistance as the preferred DVC technique.

Thermal barrier coating systems that include the ceramic layer according to the invention offer performance, cost, and manufacturing advantages over conventional TBC systems. In particular, as noted above, the TBC coatings exhibit enhanced erosion resistance and yields. The ceramic layer is also significantly less expensive because of the reduced amount of yttria required and yet has equivalent or greater spallation resistance than conventional coating systems. The ceramic layer also has better chipping and handling resistance than prior art ceramic coatings exposed to high temperature gas environments.

While the invention has been described in connection with what is presently considered to be the most practical and preferred embodiment, it is to be understood that the invention is not to be limited to the disclosed embodiment, but on the contrary, is intended to cover various modifications and equivalent arrangements included within the spirit and scope of the appended claims.

What is claimed is:

1. A thermal barrier coating applied to a metallic component of a gas turbine engine comprising a top layer of a dense vertically cracked ceramic consisting of about 4 weight % Yttria, 0–1 weight % Hafnia, and the balance Zirconia, and a bond coating adhering said ceramic layer to said metallic component, said bond coating comprising an oxidation-resistant alloy of MCrAlY with a thickness of about 0.003 to 0.025 inches, where M is iron, cobalt or nickel.

2. A thermal barrier coating as recited in claim 1, wherein said dense vertically cracked ceramic layer is about 5–100 mils thick.

3. The thermal barrier coating system as recited in claim 1, wherein said Zirconia is partially stabilized by Yttria.

4. A thermal barrier coating applied to a metallic component of a gas turbine engine comprising a top layer of a dense vertically cracked ceramic consisting of about 4 weight % Yttria, 0–1 weight % Hafnia, and the balance Zirconia, and a bond coating adhering said ceramic layer to said metallic component, said bond coating comprising a diffusion aluminide or a platinum aluminide that forms an oxidation-resistant intermetallic.

* * * * *